United States Patent [19]
Scholder et al.

[11] Patent Number: 5,457,608
[45] Date of Patent: Oct. 10, 1995

[54] ADJUSTABLE PRINTED CIRCUIT BOARD MOUNTING APPARTUS

[75] Inventors: Erica Scholder; Karl Steffes; Robert Garrett, all of Austin, Tex.

[73] Assignee: Dell USA, L.P., Austin, Tex.

[21] Appl. No.: 144,457

[22] Filed: Oct. 28, 1993

[51] Int. Cl.$^6$ ....................................................... H05K 5/00
[52] U.S. Cl. ........................... 361/752; 361/756; 361/759; 361/802; 174/255; 439/61; 211/189; 211/193; 248/560
[58] Field of Search .................................... 361/752, 759, 361/756, 796, 797, 740, 747, 801, 802, 807, 732, 809; 439/61, 325, 327; 174/255, 261; 211/96, 100, 163–165, 189, 193; 248/560, 629

[56] References Cited

U.S. PATENT DOCUMENTS 4,019,099  4/1977  Calabro ..................................... 361/399
5,113,317  5/1992  Howe ....................................... 361/413

FOREIGN PATENT DOCUMENTS 2618632  of 1989  France .................................... 361/759

Primary Examiner—Leo P. Picard
Assistant Examiner—Y. Whang
Attorney, Agent, or Firm—Mike Heim; James Huffman

[57] ABSTRACT

A printed circuit board mounting apparatus for securing a printed circuit board within a chassis includes a track affixable to the chassis and a locking mechanism affixable to the printed circuit board. The track, which includes a plurality of locking points, is slidably received within the locking mechanism, which engages the track at any of the several locking points to secure the track within the locking mechanism. The mounting apparatus described herein enables the chassis to accommodate printed circuit boards of different sizes without mechanical modification of the chassis.

10 Claims, 5 Drawing Sheets

ADJUSTABLE PRINTED CIRCUIT BOARD MOUNTING APPARTUS

BACKGROUND OF THE INVENTION

The present invention relates generally to computers and other electronic assemblies comprising printed circuit boards, and more particularly, to apparatus for affixing printed circuit boards within computer and other electronic assemblies. Still more particularly, the present invention relates to an apparatus for adjustably mounting printed circuit boards within computer and other electronic assemblies.

Computer and other electronic assemblies typically include a plurality of printed circuit (PC) boards that support electronic components. Commonly, PC boards are secured within a steel or plastic chassis for an electronic assembly by means of screws extending through holes in the PC board and threadedly engaged to a portion of the chassis.

Although this manner of attachment is reliable, it has several disadvantages. First, installation of a PC board in this manner is a very labor-intensive operation. Holes must be bored in the PC board. Corresponding female-threaded holes or receptacles must be installed in the chassis. The PC board must be aligned in the proper position, and the screws must be rotated into place. In addition, the screws and other materials are relatively costly, and the chassis, having been adapted to receive a particular size PC board, is not readily adaptable to PC boards of other sizes.

The assignee of the present invention has used an alternative PC board mounting technique by which vertically-extending plastic hooks are molded into the base of a plastic chassis. The hooks are received through slots formed in a PC board as the PC board, lying in a horizontal plane, is lowered onto the base of the chassis. After the PC board is seated on the chassis, with hooks extending through slots, the PC board is displaced horizontally to engage the hooks on the upper surface of the PC board at one end of the slots, thereby preventing vertical motion of the PC board. Thereafter, a small plastic catch mechanism is snapped into engagement with an edge of the PC board to prevent horizontal motion.

Like the method of attachment that relies on screws, the latter method of attachment works well, but is limited to a particular size of PC board for which the chassis has been especially adapted.

Hence, it would be advantageous to devise a PC board mounting apparatus that is relatively inexpensive, as well as easy to install and de-install, and that can be adjusted in such a manner that a single chassis can accommodate, without mechanical modification, PC boards of a variety of sizes.

SUMMARY OF THE INVENTION

Accordingly, there is provided herein an improved apparatus for mounting a printed circuit (PC) board within a chassis, including means for supporting the PC circuit board and means for engaging the supporting means. The supporting means is affixable to the chassis and preferably comprises an elongated member or track having a plurality of pairs of notches formed therein, the notches of each such pair being formed on opposing sides of the elongated member. The engaging means is affixable to the PC board and preferably comprises means for slidably receiving the supporting means and means for releasably gripping a pair of notches in the supporting means to lock the engaging means into place in the supporting means. The engaging means can thereby be secured at any of several different positions along the supporting means as defined by the pairs of notches.

An apparatus made in accordance with the principles of the present invention is inexpensive to manufacture and to install and de-install by comparison to the prior art techniques currently in use and has the additional advantage of enabling the chassis to accommodate PC boards of a variety of sizes without mechanical modification of the PC board or the chassis. These and other characteristics and advantages of the present invention will become readily apparent to those skilled in the art upon reading the following detailed description and claims and by referring to the accompanying drawings.

BRIEF DESCRIPTION OF THE DRAWINGS

For a more detailed description of the preferred embodiment of the invention, reference will now be made to the accompanying drawings, wherein.

DESCRIPTION OF THE PREFERRED EMBODIMENT

Current apparatus for securing printed circuit (PC) boards within a chassis include attachment by screws and by fixed-position hooks, each of which fit through holes or slots in the PC board. Neither method of attachment readily permits use of PC boards of different sizes without mechanical modification of the chassis. In accordance with the principles of the present invention, there is provided herein a PC board mounting apparatus that can accommodate any of a variety of PC board sizes without mechanical modification to the chassis.

Figure 1:
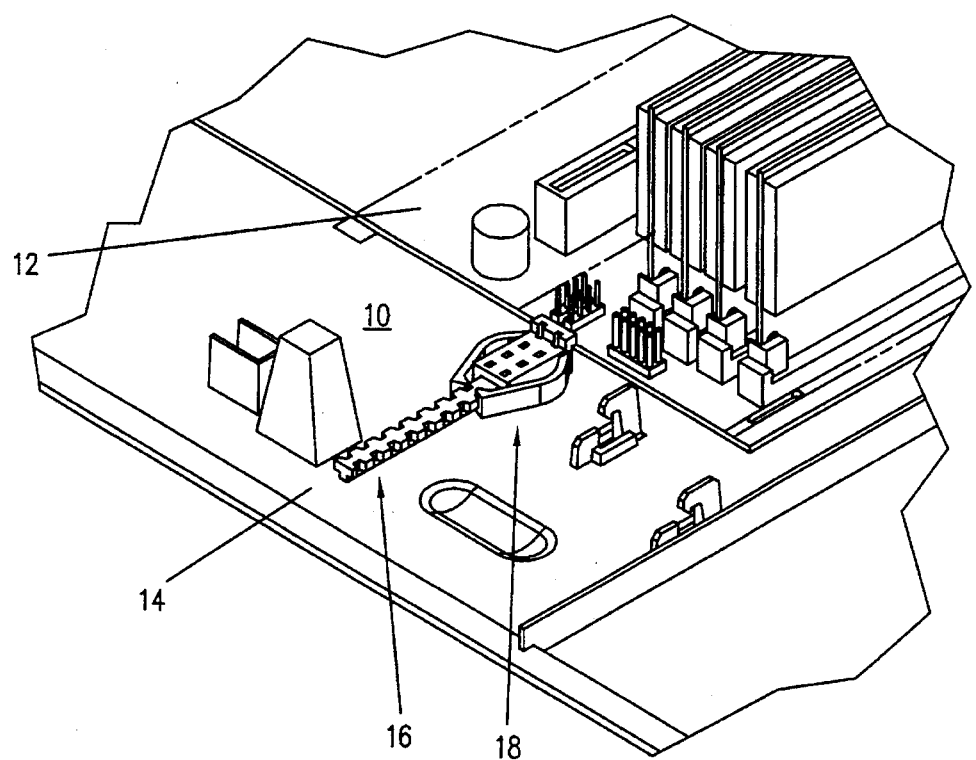
FIG. 1 is a perspective view of an apparatus constructed in accordance with the principles of the present invention for mounting a printed circuit board within a chassis.

Referring now to FIG. 1, a PC board mounting apparatus 10 constructed in accordance with the principles of the present invention secures a PC board 12 into place relative to a chassis 14. The mounting apparatus 10 comprises a track 16 and a locking mechanism 18. The track 16 is fixedly secured to the chassis 14, and in the assembled condition, supports the PC board 12 relative to the chassis 14. The locking mechanism 18 is affixed to the PC board 12, and in the assembled condition, engages the track 16 to lock the PC board 12 thereto.

The mounting apparatus 10 preferably is injection molded of a dielectric plastic material having a modulus of elasticity that will permit operation of the apparatus as described herein and will enable the apparatus 10 to support the mass of the particular PC board or boards with which the apparatus may be used. One suitable plastic material is polycarbonate/ABS resin such as Dow PULSE 1725; however, one with skill in the art will be capable of selecting another suitable plastic material from among the many available on the market.

Figure 2:
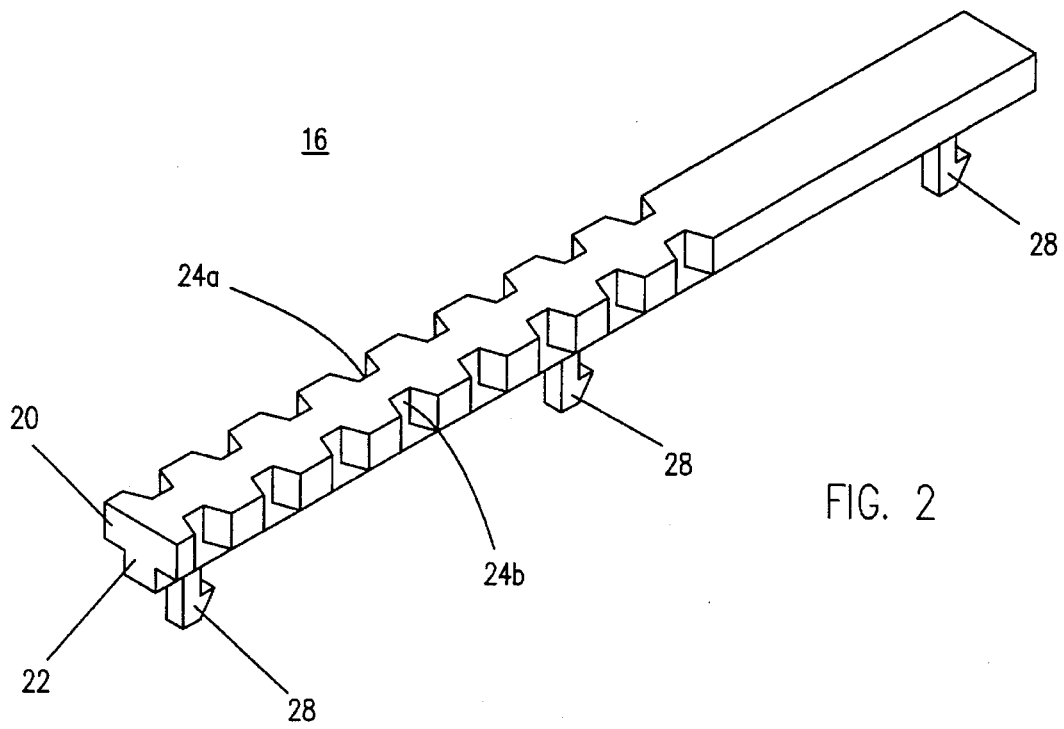
FIG. 2 is a perspective view of the track portion of the apparatus depicted in FIG. 1.
Figure 6:
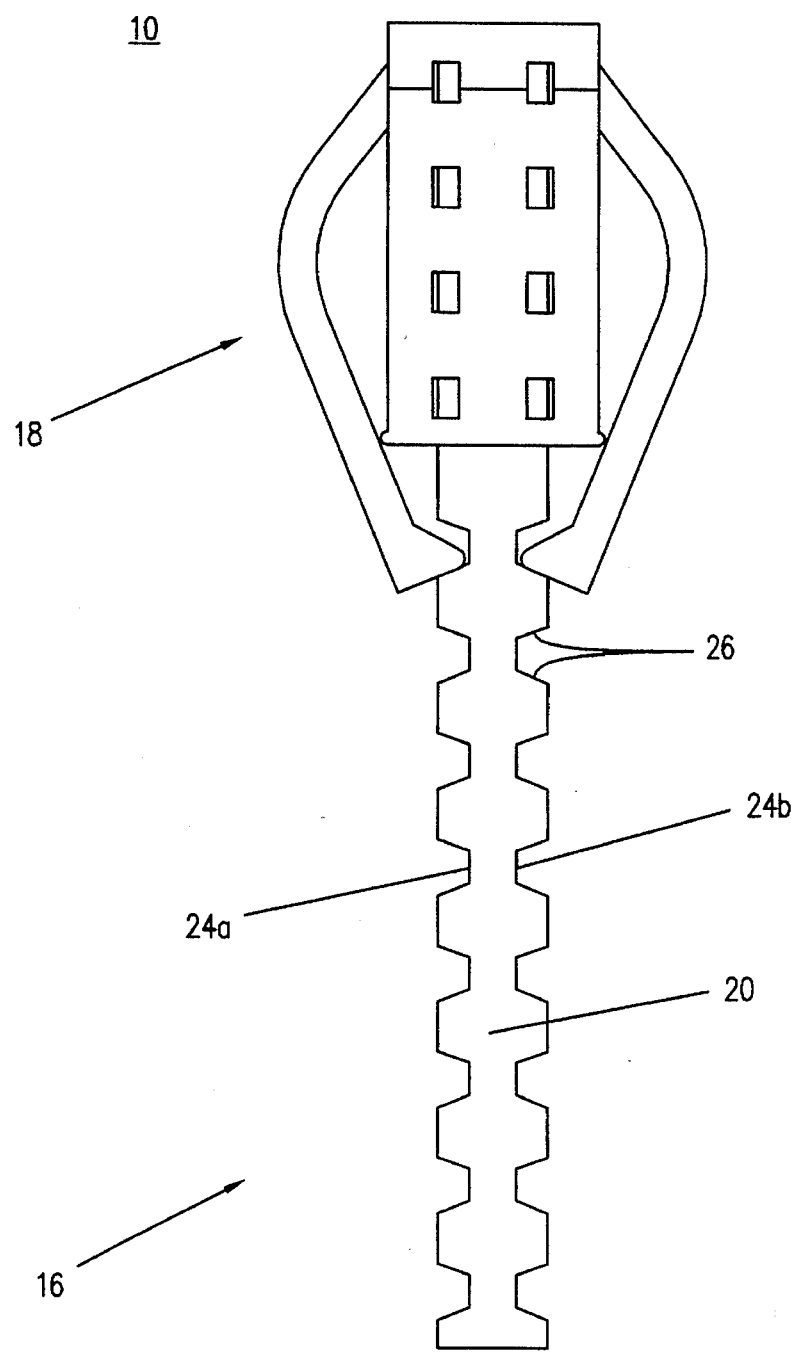
FIG. 6 depicts the assembled track and locking mechanism from FIG. 5 in top elevation.

Referring now to FIGS. 2 and 6, the track 16 comprises an elongated member having a generally "T" shaped cross section defining an upper portion 20 and a base portion 22. The upper portion 20 includes a plurality of pairs of notches 24a,b formed therein. The notches of each pair 24a,b are positioned on opposing sides of the upper portion 20 of the track 16 and are aligned back-to-back. Each notch preferably comprises beveled edges 26 as indicated most clearly in FIG. 6. The number, spacing, and arrangement of the notches along the upper portion 20 of the track 16 may be modified and adjusted as necessary to accommodate the size of the chassis 14 and the various sizes of the PC board 12 that may be used.

Figure 5:
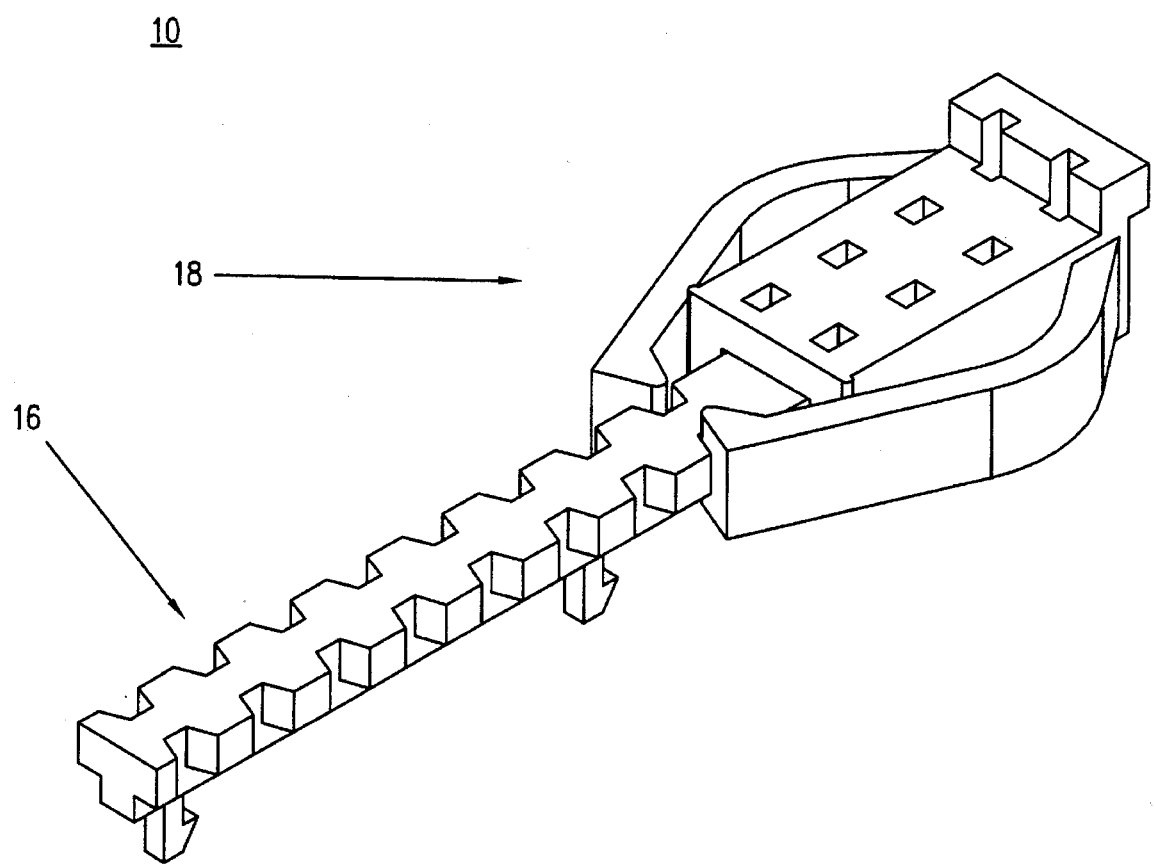
FIG. 5 is a perspective view of the track from FIG. 2 assembled with the locking mechanism from FIG. 3.

The base portion 22 of the track 16 preferably includes a plurality of downwardly protruding hooks 28 that can be snapped into holes or slots (not shown) in the chassis 14. Alternatively, the track 16 may be affixed to the chassis by any of several other suitable methods well known to persons of skill in the art, or the track may be molded as an integral part of the chassis 14. As shown in FIG. 5, the base portion 22 spaces the upper portion 20 of the track 16 away from the chassis 14 to permit the locking mechanism 18 to slide along the underside of the upper portion 20, as more clearly described below.

Figure 3:
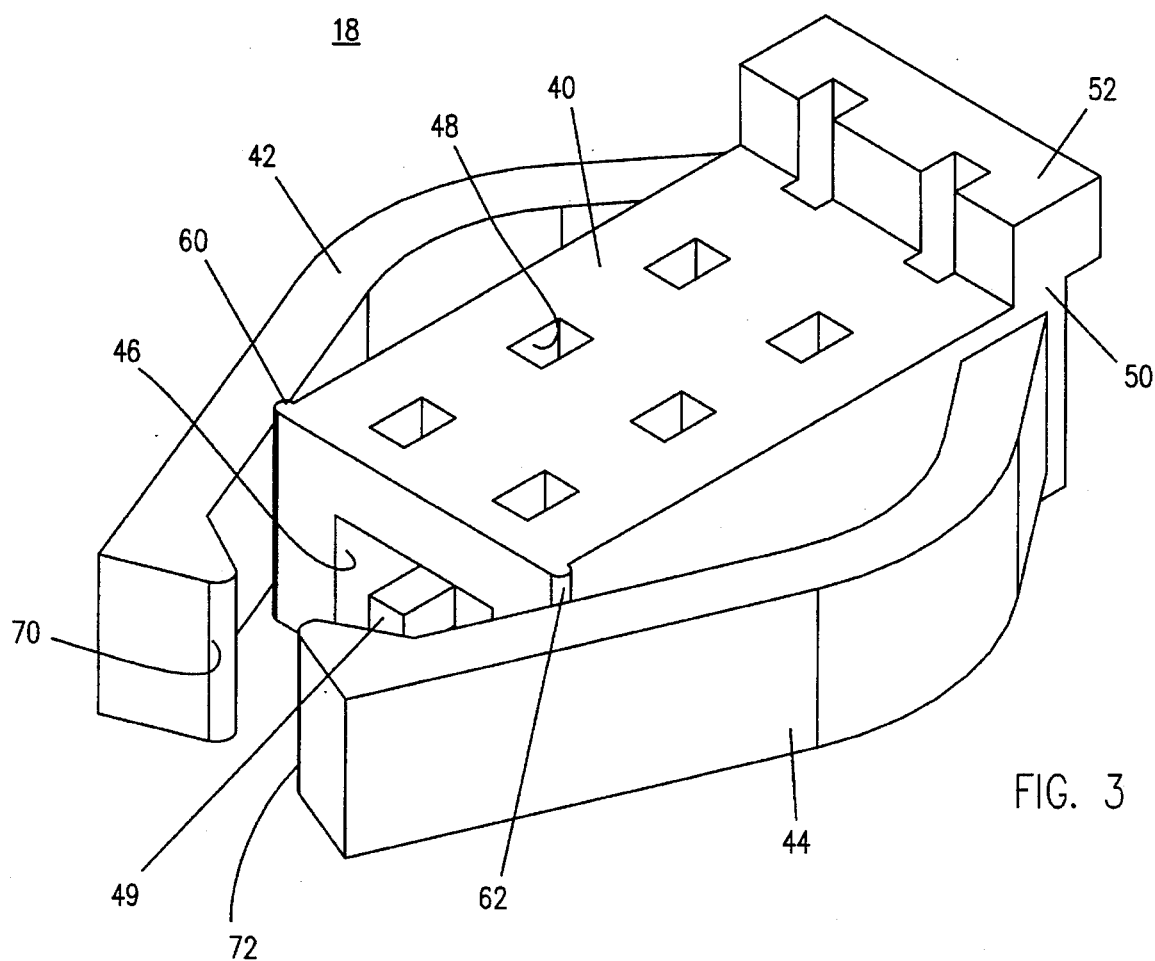
FIG. 3 is a perspective view of the locking mechanism portion of the apparatus depicted in FIG. 1.
Figure 4:
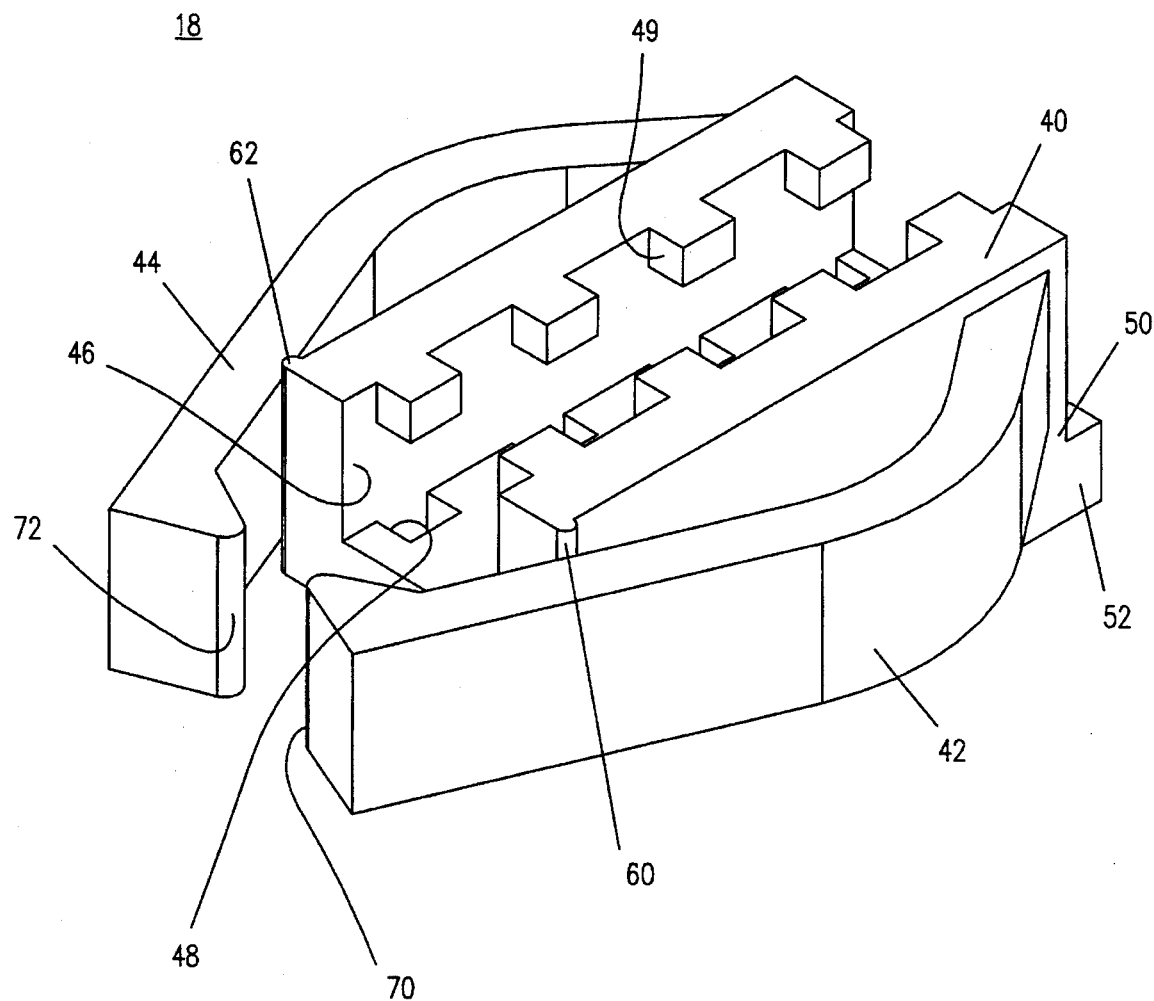
FIG. 4 is a perspective view of the opposite side of the locking mechanism depicted in FIG. 3.

Referring now to FIGS. 3 and 4, the locking mechanism 18 comprises a housing 40, a left locking arm 42, and a right locking arm 44. The housing 40 comprises a generally rectangular-shaped member having an opening or slot 46 formed therein for receiving the track 16 as more particularly described below. The housing 40 includes securing means 50 at a rearward end thereof for securing the housing 40 to the printed circuit board and a pair of extensions 60, 62 from the sides of the housing 40 at the forward end thereof.

The preferred embodiment of the housing 40 shown in FIGS. 3 and 4 includes openings 48 on the upper side (FIG. 3) thereof and includes spaced, inwardly extending projections 49 partially enclosing the slot 46 on the lower side (FIG. 4) of the housing 40. This generally open design of the housing 40 simplifies the manufacture of the housing by injection molding techniques and minimizes the amount of material needed to manufacture the housing 40, but in no way reflects essential features of the design of the housing 40. One skilled in the art will recognize readily that the housing 40 may be designed in any of numerous different configurations for accomplishing the purposes as described herein.

The securing means 50 of the preferred embodiment comprises a flange 52 projecting rearwardly from the housing 40 whereby the housing 40 may be affixed by suitable means such as screws to the PC board. The flange 52 is positioned relative to the housing 40 such that when the track 16 (FIG. 5) is assembled with the housing 40, the track projects along a surface of the PC board without engaging an edge of the PC board. Alternatively, one skilled in the art will recognize that the securing means 50 may comprise other suitable and known means for securely attaching a support member to a PC board.

The extensions 60, 62 project away from the housing 40 a sufficient distance to function as fulcrums in cooperation with the left and right locking arms 42, 44, as more particularly described below.

Referring still to FIGS. 3 and 4, the left and right locking arms 42, 44 project arcuately from the rearward side of the housing 40, past the left and right extensions 60, 62, to a point forward of the front end of the housing. Each arm 42, 44 includes at the forward end thereof an inwardly projecting foot 70, 72 for engagement with a pair of notches 24a,b (FIG. 2) upon assembly with the track 16.

The locking arms 42, 44 preferably are manufactured integrally with the housing 40 from a plastic material that will permit flexure of the arms 42, 44 when they are squeezed toward one another, causing the forward end of the arms 42, 44 and the feet 70, 72 thereon to open by pivoting away from one another on the fulcrums formed by the extensions 60, 62 on the housing 40. This open condition of the arms 42, 44 enables a sliding motion of the track 16 (FIG. 5) within the slot 46 in the housing 40. The track 16 (FIG. 5) is locked into position within the housing 40 when pressure on the arms 42, 44 is released, allowing the forward end of the arms and the feet 70, 72 thereon to resume the normal, closed position, with the feet 70, 72 engaged within a pair of notches 24a,b, as shown in FIG. 5.

One having skill in the art will appreciate that the foregoing description of attributes and advantages to be experienced in constructing the apparatus described herein is not exhaustive of all features of the present invention. It will be appreciated that modifications for the aforedescribed preferred embodiment of the invention can be made without departing in substance from the principles of the invention.

What is claimed is:

1. Adjustable apparatus for mounting a printed circuit board within a chassis, comprising:

a track attachable to a chassis, said track defining a plurality of locking points;

a locking mechanism attachable to a printed circuit board for locking onto said track at one of the plurality of locking points;

wherein said locking means comprises:

a housing with an opening for receiving and slidably embracing said track; and arms for releasably grasping Said track at one Of the plurality of locking points.

2. Apparatus according to claim 1, wherein said track comprises an elongated member having a plurality of pairs of notches formed therein, the notches of each such pair being formed on opposing sides of said elongated member and defining a locking point.

3. Apparatus for securing a printed circuit board within a chassis, comprising:

track means affixable to a chassis and including an elongated member having a plurality of pairs of notches formed therein, the notches of each such pair being formed on opposing sides of said elongated member; and engaging means affixable to a printed circuit board for engaging said track means, said engaging means including means for slidably receiving said track means and means for releasably gripping a pair of notches in said track means, whereby said apparatus is capable of securing the printed circuit board at a plurality of different positions relative to the chassis.

4. Apparatus according to claim 3, wherein said track means further comprises a base portion, including, means for attaching said track means to the chassis, and means for spacing the elongated member away from the chassis, whereby the elongated member is slidably receivable within said track means without interference by the chassis.

5. Apparatus according to claim 3, wherein said receiving means comprises a housing member having a slot therethrough for embracing on at least three sides a portion of said track means received therein.

6. Apparatus according to claim 3, wherein said gripping means comprises a pair of arms adapted for pivotal motion into and out of engagement with a pair of notches in said track means.

7. Apparatus according to claim 6 wherein said engaging means is formed of a plastic material.

8. Apparatus according to claim 7 wherein said track means is formed of a plastic material.

9. Apparatus according to claim 7 wherein said track means is formed integrally with the chassis.

10. Adjustable apparatus for mounting a printed circuit board within a chassis, comprising:

a track attachable to a chassis, said track defining a plurality of locking points;

a locking mechanism attachable to a printed circuit board for locking onto said track at one of the plurality of locking points;

wherein said track comprises an elongated member having a plurality of pairs of notches formed therein, the notches of each such pair being formed on opposing sides of said elongated member and defining a locking point.

\* \* \* \* \*